United States Patent
Tamaoka et al.

(10) Patent No.: US 6,232,237 B1
(45) Date of Patent: May 15, 2001

(54) METHOD FOR FABRICATING SEMICONDUCTOR DEVICE

(75) Inventors: Eiji Tamaoka, Osaka; Nobuo Aoi, Hyogo; Tetsuya Ueda, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/206,982

(22) Filed: Dec. 8, 1998

(30) Foreign Application Priority Data

Dec. 12, 1997 (JP) .................................................. 9-343290

(51) Int. Cl.[7] ...................... H01L 21/4763; H01L 21/461; G03C 5/00; B08B 6/00
(52) U.S. Cl. ..................... 438/725; 438/637; 438/710; 438/734; 438/738; 430/329; 134/1.2
(58) Field of Search ..................... 438/725, 710, 438/714, 734, 735, 738, 637–640; 430/329; 134/1.2

(56) References Cited

U.S. PATENT DOCUMENTS

| | | | |
|---|---|---|---|
| 3,890,176 | * 6/1975 | Bolon | 156/2 |
| 4,961,820 | * 10/1990 | Shinagawa et al. | 156/643 |
| 4,985,374 | * 1/1991 | Tsuji et al. | 437/229 |
| 5,397,432 | 3/1995 | Konno et al. | |
| 5,407,866 | * 4/1995 | Sellers | 437/225 |
| 5,773,201 | * 6/1998 | Fujimura et al. | 430/329 |
| 5,780,406 | * 7/1998 | Honda et al. | 510/175 |
| 5,888,309 | * 3/1999 | Yu | 134/1.2 |
| 5,888,905 | * 3/1999 | Taylor et al. | 438/705 |
| 5,925,577 | * 7/1999 | Solis | 438/725 |
| 5,970,376 | * 10/1999 | Chen | 438/637 |
| 5,981,398 | * 11/1999 | Tsai et al. | 438/710 |

FOREIGN PATENT DOCUMENTS

| | | |
|---|---|---|
| 53-114742 | 10/1978 | (JP) . |
| 56-135928 | 10/1981 | (JP) . |
| 2-12818 | 1/1990 | (JP) . |
| 2-49425 | 2/1990 | (JP) . |
| 07-022506 | 1/1995 | (JP) . |
| 08-316209 | 11/1996 | (JP) . |
| 09-022903 | 1/1997 | (JP) . |
| 9-219448 | 8/1997 | (JP) . |
| 9-232428 | 9/1997 | (JP) . |

* cited by examiner

*Primary Examiner*—Richard Booth
*Assistant Examiner*—Ha Tran Nguyen
(74) *Attorney, Agent, or Firm*—McDermott, Will & Emery

(57) ABSTRACT

A method for fabricating a semiconductor device according to the present invention includes the steps of: a) forming an insulator film having Si—H bonds; b) forming a resist mask over a selected region of the insulator film; c) etching part of the insulator film that is not covered with the resist mask, thereby forming a recess in the insulator film; and d) removing the resist mask. The step d) includes the step of e) ashing the resist mask by using plasma produced from a gas comprising water vapor as a main component.

7 Claims, 9 Drawing Sheets

Plasma Treatment Conditions

|  | H2O Plasma | O2 Plasma |
|---|---|---|
| Gas Flow | H2O 500 sccm | O2 3000 sccm<br>N2 200 sccm |
| Microwave Power | 500W | |
| Pressure | 2.0Torr | |
| Temperature | 300°C | |
| Treatment Time* | 210sec. | 150sec. |
| Resist Ashing Rate | 2.2 μm/min. | 3.1 μm/min. |

\* Treatment time was determined to equalize the each amount of resist removal by H2O plasma and O2 plasma.

Si-H($\sim$2250cm$^{-1}$) remaining is defined as the absorption peak height.

FIG. 12
| Plasma Treatment | Si-H Remaining *1 | Total Water Evolution (RT~800°C) *2 | Dielectric Constant | Leakage Current (A/cm²:@0.1MV/cm) | Degradation Region |
|---|---|---|---|---|---|
| H2O Plasma | 90 | 120 | 3.2 | 3.6E-09 | No |
| O2 Plasma | 62 | 240 | 4.0 | 7.7E-09 | Observed |
| No Treatment | 100 | 100 | 3.0 | 1.9E-09 | No |
*1: Relative Amount (As-cured film=100)
*2: Relative Amount (As-cured film=100)
FIG. 13
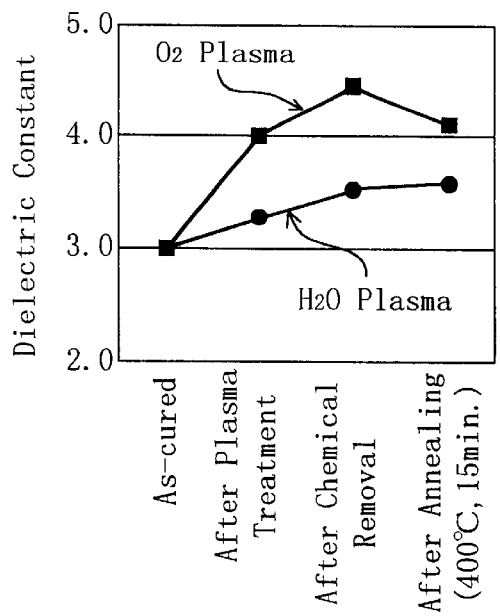
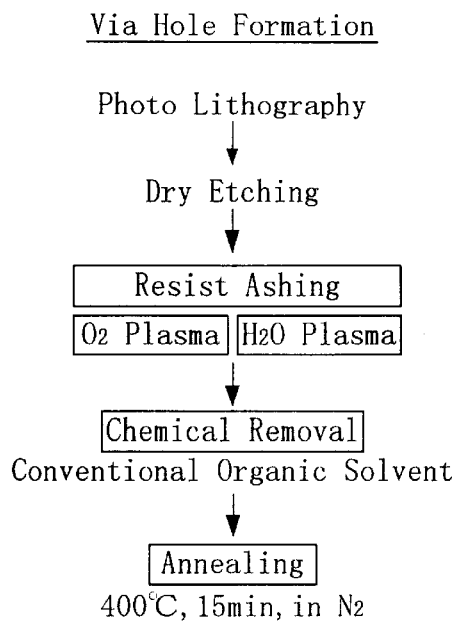

METHOD FOR FABRICATING SEMICONDUCTOR DEVICE

BACKGROUND OF THE INVENTION

The present invention relates to a method for fabricating a semiconductor device, and more particularly relates to a method including the process step of ashing a resist mask.

As the number of semiconductor devices integrated on a single wafer has been tremendously increased in LSI's, for example, it has become more and more necessary to form interconnection structures having an even larger number of layers stacked therein with a higher and higher density. The upperlevel portion of such a multilevel interconnection structure has a larger step. Thus, if a fine-line wiring pattern is formed over such a step, then various problems such as disconnection or breaking of interconnections possibly happen. Accordingly, in order to form a multilevel interconnection structure more easily, the surface of the interlevel dielectric thereof should be planarized. Various techniques have been researched and developed to planarize the surface of an interlevel dielectric. Among other things, a spin-on-glass (SOG) technique is widely used because the process can be carried out easily. In accordance with the SOG technique, a liquid insulator made of an inorganic or organic material is applied onto the stepped surface of a semiconductor substrate so as to form an interlevel dielectric with a planarized surface.

On the other hand, as an interconnection structure has been formed with a higher and higher density, wiring capacitance thereof has also increased. Wiring capacitance is one of the factors increasing signal propagation delay, power consumption, crosstalk and the like, and thus seriously affects the operating characteristics of a semiconductor device. In order to reduce wiring capacitance, an insulator having a low relative dielectric constant is required.

Silicon dioxide ($SiO_2$), formed by thermal oxidation or chemical vapor deposition (CVD), is a typical insulator currently used. The relative dielectric constant of $SiO_2$ is in the range from about 3.9 to about 5.0. However, this relative dielectric constant is not low enough to reduce the wiring capacitance satisfactorily. Accordingly, a material having an even lower dielectric constant is required. Various techniques have been proposed to form an insulator film having a low dielectric constant. The SOG technique is also used widely for such a purpose.

In recent years, hydrogen silsesquioxane (HSQ) is the object of attention as a material for an insulator film having a relative dielectric constant as low as about 3.0. HSQ is described in detail in an article by Valance et al. (1992 VMIC Conference) and in an article by Plamanick et al. (1993 VMIC Conference). As shown in FIG. 1, HSQ has a cubic polymer structure and is expressed by a general formula $(HSiO_{1.5})_{2n}$ (where n=2 to 8). An HSQ layer can be formed by the SOG technique. Specifically, a substrate is spin-coated with HSQ and baked at 400° C. within a nitrogen ambient. As a result, polymers are bonded to each other, thereby forming an HSQ layer.

Next, a conventional method for fabricating a semiconductor device using HSQ will be described with reference to FIGS. 2A through 2H. In the following example, a prior-art semiconductor device having a two-layer interconnection structure will be exemplified for the sake of simplicity.

First, as shown in FIG. 2A, a structure including a first interconnection layer 3 is formed on an insulator layer 2 on a semiconductor substrate 1. Over the first interconnection layer 3, a first silicon dioxide layer 4 is deposited in accordance with a thin film deposition technique such as CVD.

Next, as shown in FIG. 2B, an HSQ layer 5 is formed by the SOG technique. Then, as shown in FIG. 2C, a second silicon dioxide layer 6 is formed over the HSQ layer 5 by a plasma CVD technique or the like.

Subsequently, as shown in FIG. 2D, a resist mask 7 is formed over an interlevel dielectric film having a three-layer structure formed in this manner. Thereafter, a predetermined part of the resist mask 7 is removed by a known photolithography technique to provide an opening in the resist mask 7. Then, as shown in FIG. 2E, part of the three-layer interlevel dielectric film, which part is not covered with the resist mask 7, is removed by a dry etching technique so as to form a via hole 8 in the interlevel dielectric film.

Next, as shown in FIG. 2F, the resist mask 7 is ashed and removed by using oxygen ($O_2$) plasma 15. During this process step of ashing the resist mask 7 using the $O_2$ plasma 15, the part of the three-layer interlevel dielectric film, where the via hole 8 is formed, is exposed to the $O_2$ plasma 15. The silicon dioxide layers 4 and 6, which have been formed by the plasma CVD technique, are highly resistant to the $O_2$ plasma 15 and are not affected during this process. By contrast, the HSQ layer 5 has poor resistance to the $O_2$ plasma 15, and is easily oxidized. As a result, the components of the film are dissolved to deform and dent the film or form an altered layer 16 (i.e., degraded region) as shown in FIG. 2G. The altered layer 16 is a film containing a lot of water. In such a state, if a plug 10 is made of tungsten or the like in the via hole 8 to form a second interconnection layer 11, then water is ejected from the altered layer 16 during subsequent process steps. The ejection of water makes plugs 10 and interconnections 11 defective, and contributes to disconnection thereof and increase in resistance (see FIG. 2H).

The fact that an HSQ layer is altered and the content of water is increased as a result of the oxygen plasma is disclosed, for example, in an article by B. T. Ahlburn, G. A. Brown, T. R. Seha and T. F. Zoes, "Hydrogen Silsesquioxane-based Flowable Oxide as an Element in the Interlevel Dielectric for Sub 0.5 Micron ULSI Circuits", 1995 Proceedings Dielectrics for VLSI/ULSI Multilevel Interconnection Conference, p.36). According to Ahlburn et al., Si—H bonds in an HSQ layer are oxidized by oxygen plasma to produce Si—O bonds and H—OH bonds, and OH groups constitute water in the film. In addition, oxidation shrinks the film or deforms and dents the film.

In fabricating a semiconductor device using the HSQ material in the above-described manner, during the removal of a resist mask by an ashing technique using oxygen plasma, the oxygen plasma adversely deforms and dents the HSQ material exposed or alters the HSQ film into a highly hygroscopic film containing a lot of water. Moreover, during a subsequent process step of forming interconnections, gases such as water vapor disadvantageously come out of the altered layer to form defective interconnections.

In accordance with a method for preventing the HSQ layer from being degraded during the process step of ashing and removing the resist mask, a structure, in which the HSQ layer is not exposed inside the via hole over the pattern of the first interconnection layer, is formed by etching back the HSQ layer so as not to leave the HSQ layer over the pattern of the first interconnection layer. This etchback method, however, has various problems. For example, it is difficult to accurately control such a process; the number of required process steps increases; and wiring capacitance cannot be sufficiently reduced because the fringe components of the capacitance cannot be reduced during the formation of a film out of a material having a low dielectric constant.

SUMMARY OF THE INVENTION

In view of the above-described problems, the present invention relates to a method for fabricating a semiconductor device in such a manner that resist ashing does not adversely affect an exposed surface of an insulator film.

In accordance with an exemplary embodiment, the present invention relates to a method for fabricating a semiconductor device, comprising the steps of: a) forming an insulator film having Si—H bonds; b) forming a resist mask over a selected region of the insulator film; c) etching a part of the insulator film that is not covered with the resist mask, thereby forming a recess in the insulator film; and d) removing the resist mask. The step d) includes the step of e) ashing the resist mask by using plasma produced from a gas comprising water vapor as a main component.

In accordance with another exemplary embodiment, the present invention relates to a method for fabricating a semiconductor device, comprising the steps of: a) forming an insulator film having Si—H bonds; b) forming a resist mask over s a selected region of the insulator film; c) etching a part of the insulator film that is not covered with the resist mask, thereby forming a recess in the insulator film; and d) removing the resist mask. The step d) includes the step of e) ashing the resist mask by using plasma produced from a gas comprising hydrogen.

In accordance with still another exemplary embodiment, the present invention relates to a method for fabricating a semiconductor device, comprising the steps of: a) forming an insulator film; b) forming a resist mask over a selected region of the insulator film; c) etching a part of the insulator film that is not covered with the resist mask, thereby forming a recess in the insulator film; and d) removing the resist mask. The step d) includes the step of e) ashing the resist mask by using plasma produced from a gas comprising water vapor as a main component.

In accordance with yet another exemplary embodiment, the present invention relates to a method for fabricating a semiconductor device, comprising the steps of: a) forming an insulator film; b) forming a resist mask over a selected region of the insulator film; c) etching a part of the insulator film that is not covered with the resist mask, thereby forming a recess in the insulator film; and d) removing the resist mask. The step d) includes the step of e) ashing the resist mask by using plasma produced from a gas comprising hydrogen.

Advantages of the present invention will become apparent to those skilled in the art from the following detailed description of exemplary embodiments, which exemplify the best mode of carrying out the invention.

The invention itself, together with further objects and advantages, can be better understood by reference to the following detailed description and the accompanying drawings.

BRIEF DESCRIPTION OF THE DRAWINGS

FIG. 12 is a chart summarizing the experimental results.

FIG. 13 illustrates the variation of the dielectric constant throughout the resist removal process for the respective plasma treatments.

DESCRIPTION OF THE PREFERRED EMBODIMENTS

Hereinafter, preferred embodiments of the method for fabricating a semiconductor device according to the present invention will be described with reference to the accompanying drawings.

EMBODIMENT 1

The first embodiment of the present invention will be described with reference to FIGS. 3A through 3H.

Figure 1:
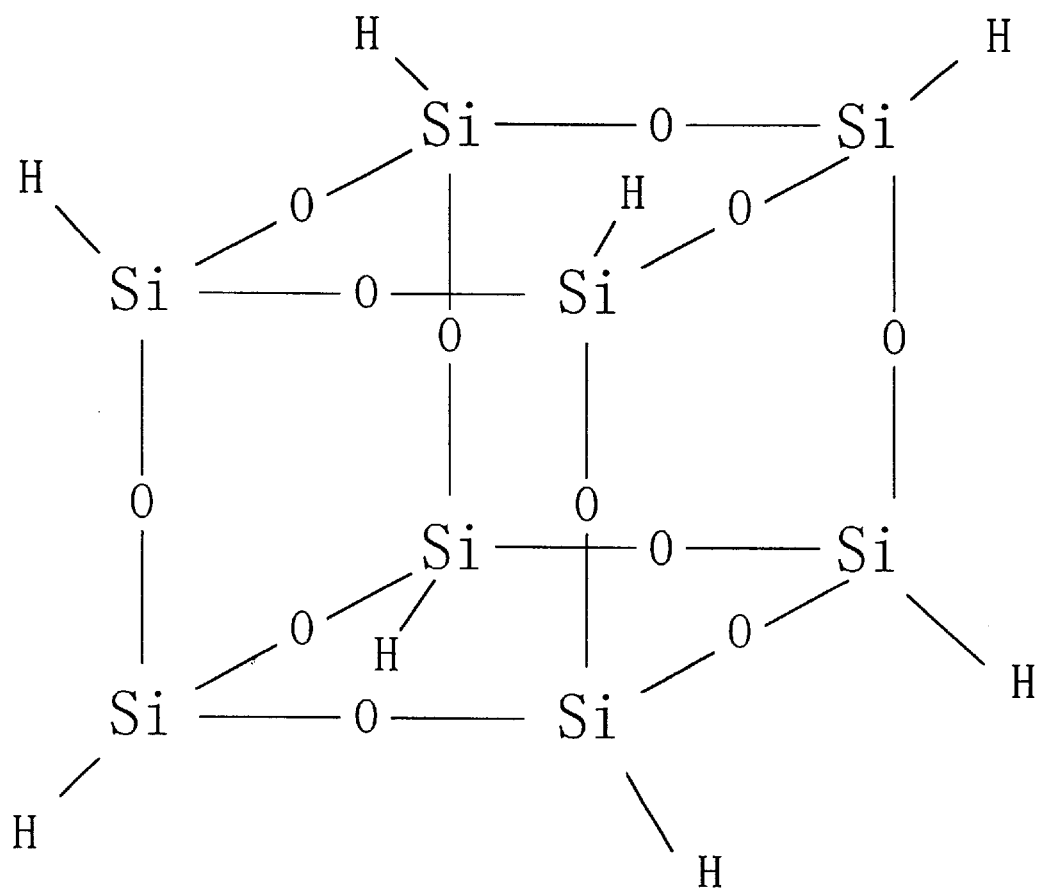
FIG. 1 is a diagram illustrating a polymer structure of an HSQ layer.
Figure 2A:
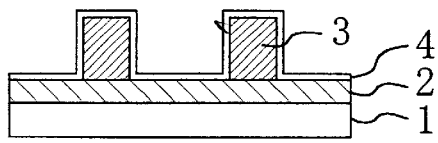
FIGS. 2A through 2H are cross-sectional views illustrating respective process steps of a conventional method for fabricating a semiconductor device.
Figure 2B:
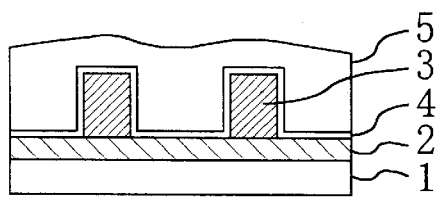
Figure 2C:
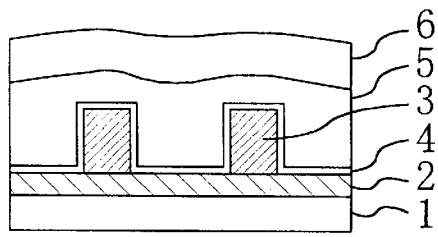
Figure 2D:
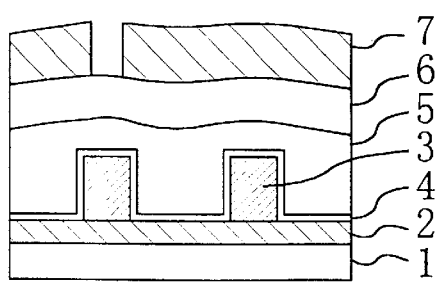
Figure 2E:
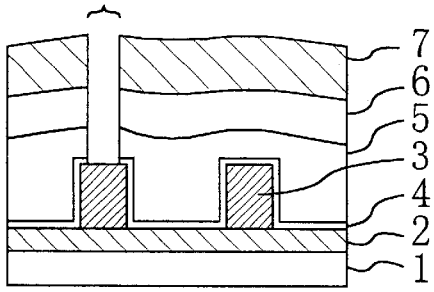
Figure 2F:
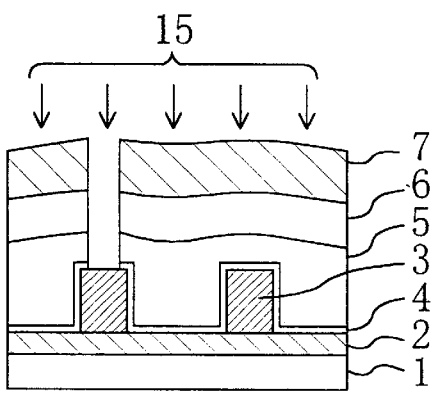
Figure 2G:
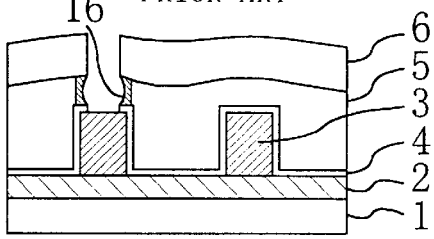
Figure 2H:
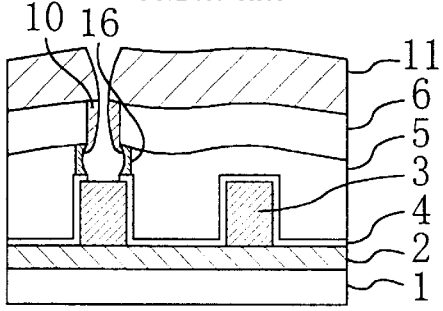
Figure 3A:
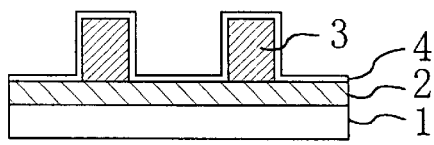
FIGS. 3A through 3H are cross-sectional views illustrating respective process steps for fabricating a semiconductor device according to a first embodiment of the present invention.

First, as shown in FIG. 3A, a structure including a first interconnection layer 3 is formed over a semiconductor substrate 1 made of single crystalline silicon, with an insulator layer 2 (exemplary thickness: in the range from approximately 500 nm to 1000 nm) interposed therebetween. The first interconnection layer 3 is formed by patterning a thin film of aluminum or an aluminum alloy, for example. The typical height of the first interconnection layer 3 is in the range from approximately 0.5 µm to 1.0 µm and the typical width thereof is in the range from approximately 0.3 m to 0.6 µm. Over the first interconnection layer 3, a first silicon dioxide layer 4 (exemplary thickness: in the range from approximately 50 nm to 200 nm) is deposited in accordance with a thin film deposition technique such as a plasma CVD process. The first silicon dioxide layer 4 improves the adhesion between an HSQ layer to be formed during a subsequent process step and the first interconnection layer 3.

Figure 3B:
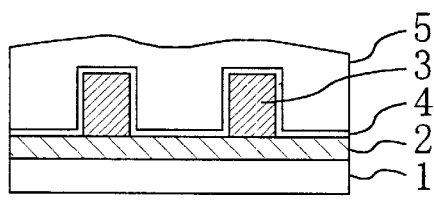
Figure 3C:
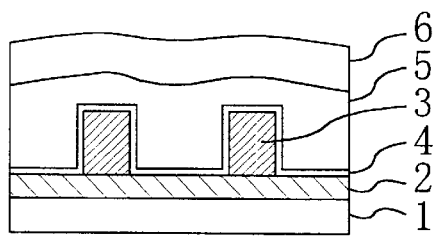

Next, as shown in FIG. 3B, an SOG layer 5 made of HSQ (hereinafter, simply referred to as an "HSQ layer") is applied onto the first silicon dioxide layer 4 by using a spin coater and the substrate is baked at 400° C. for 60 minutes within a nitrogen ambient. Thereafter, as shown in FIG. 3C, a second silicon dioxide layer 6 (exemplary thickness: in the range from approximately 400 nm to 1000 nm) is deposited over the HSQ layer 5 in accordance with a plasma CVD process or the like.

Figure 3D:
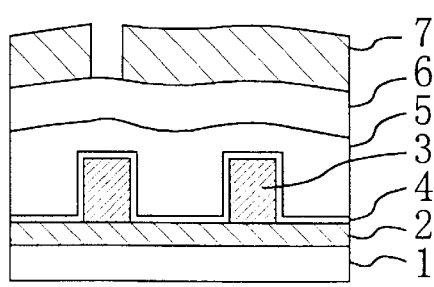
Figure 3E:
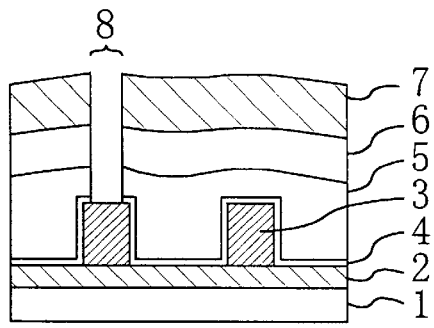

Subsequently, as shown in FIG. 3D, a resist mask 7 (exemplary thickness: in the range from approximately 0.8 µm to 1.3 µm) is formed over an interlevel dielectric film having a three-layer structure consisting of: the first silicon dioxide layer 4; the HSQ layer 5; and the second silicon dioxide layer 6. Thereafter, a predetermined part of the resist mask 7 is removed in accordance with a known photolithography technique, thereby forming an opening in the resist mask 7. This opening defines the shape and position of a recess (via hole) to be formed during a subsequent process step. In this case, the interlevel dielectric film having this three-layer structure may be called an "insulator film having Si—H bonds" because the interlevel dielectric film includes an insulator layer having Si—H bonds (i.e., the HSQ film 5). Then, as shown in FIG. 3E, part of the interlevel dielectric film 4, 5 and 6 having a three-layer structure that is not covered with the resist mask 7 is removed by a dry etching technique to form a via hole 8 in the interlevel dielectric film. The via hole 8 reaches the surface of the underlying interconnection 3 and thereby exposes part of the interconnection 3. The dry etching is performed using a mixed gas of $CF_4$ (flow rate: 10 sccm), $CHF_3$ (flow rate: 30 sccm), Ar (flow rate: 100 sccm) and $N_2$ (flow rate: 10 sccm) as an etching gas on the conditions that pressure is 150 mTorr and power is 1100 W.

Figure 3F:
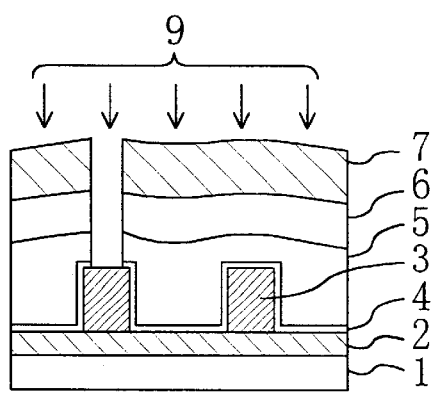
Figure 3G:
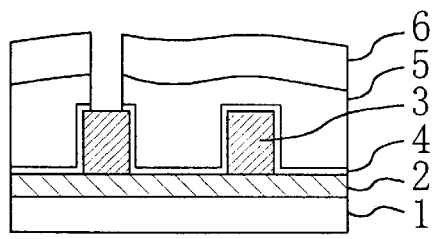

Next, as shown in FIG. 3F, the resist mask 7 is ashed and removed by using water ($H_2O$) plasma 9. The $H_2O$ plasma 9 can be produced in the following manner. First, water vapor ($H_2O$) is introduced into the reaction chamber of an ashing apparatus at a flow rate in the range from approximately 100 sccm to 500 scam, and the total pressure inside the reaction chamber is kept at approximately 1 to 2 Torr. In such a state, microwaves having a frequency of 2.45 GHz are supplied to electrodes inside the ashing apparatus, thereby ionizing the water vapor inside the reaction chamber and generating plasma. The power of the microwaves is preferably set at approximately 0.5 to 1.0 kW and the semiconductor substrate 1 is preferably heated up to a temperature in the range from about 100° C. to about 300° C. By ashing and removing the resist mask 7 using the $H_2O$ plasma 9 in this manner, respective portions of the HSQ layer 5 and the silicon dioxide layers 4 and 6, which are exposed on the inner side faces of the via hole 8, are neither adversely affected nor degraded (FIG. 3G).

Figure 3H:
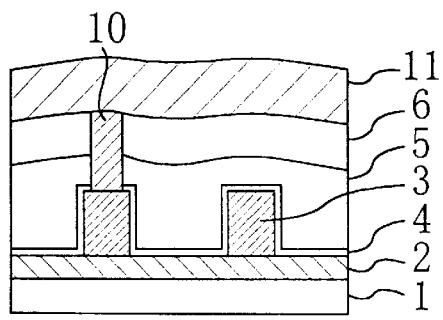

Finally, as shown in FIG. 3H, the via hole 8 is filled in with a plug 10 made of tungsten, and a second interconnection layer 11 is formed over the interlevel dielectric film.

In this embodiment, the present invention has been described as being applied to a method for fabricating a semiconductor device having a two-layer interconnection structure. Alternatively, the present invention is naturally applicable to the fabrication of a semiconductor device having a singlelayer interconnection structure or any other multilevel interconnection structure including three or more layers.

Figure 4:
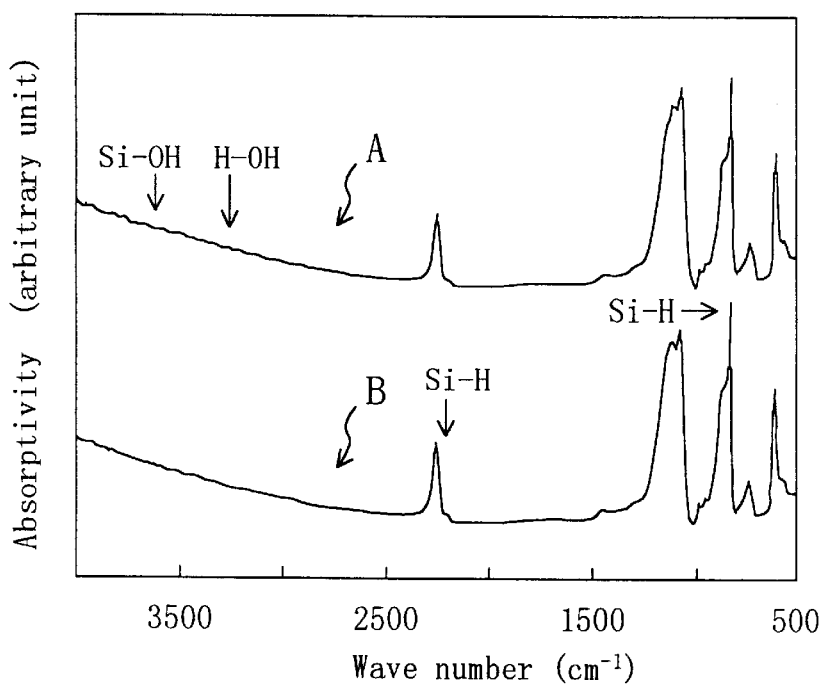
FIG. 4 is a graph illustrating the Fourier transform infrared (FTIR) absorption spectra of an HSQ film before and after water ($H_2O$) plasma processing is performed.
Figure 5:
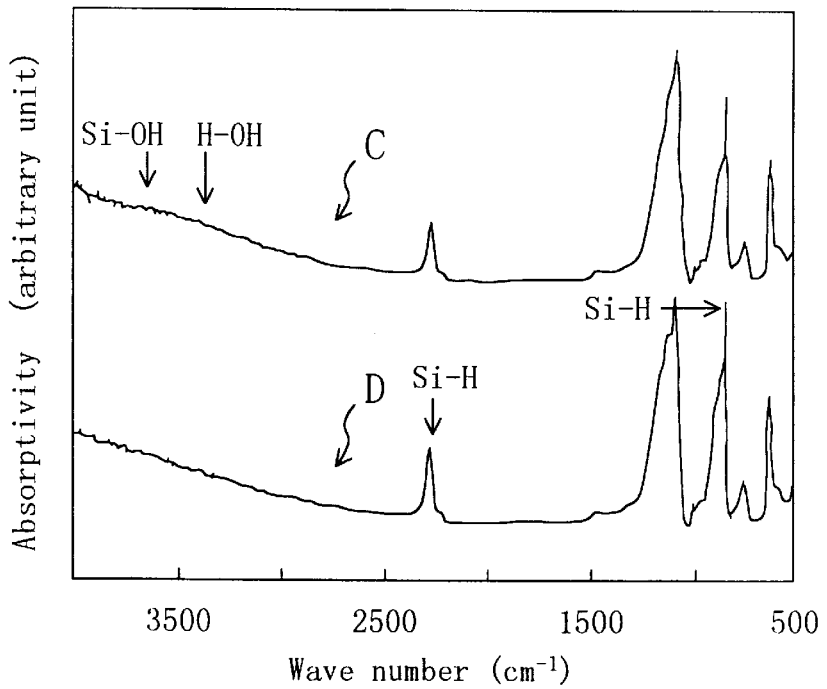
FIG. 5 is a graph illustrating the FTIR absorption spectra of an HSQ film before and after oxygen ($O_2$) plasma processing is performed.

FIG. 4 illustrates the Fourier transform infrared (FTIR) absorption spectra of a single-layer HSQ film formed over a semiconductor substrate and exposed to the $H_2O$ plasma 9. In contrast, FIG. 5 illustrates the FTIR absorption spectra of a single-layer HSQ film formed over a semiconductor substrate and exposed to $O_2$ plasma as in conventional processes.

Comparing the spectrum (B in FIG. 4) before the HSQ film is exposed to the $H_2O$ plasma 9 to the spectrum (A in FIG. 4) after the exposure, it can be understood that the heights of absorption peaks owing to Si—H bonding hardly change before and after the plasma processing. Also, no absorption peaks resulting from Si—OH and H—OH bonding are observed in FIG. 4. In contrast, if the HSQ film is exposed to $O_2$ plasma as in conventional processes, the height of the peak owing to Si—H bonding after the HSQ film has been exposed to the $O_2$ plasma (spectrum C in FIG. 5) is lower than that of the peak before the exposure (spectrum D in FIG. 5). In addition, some absorption peaks owing to Si—OH and H—OH bonding resulting from water in the film are also observed.

Figure 6:
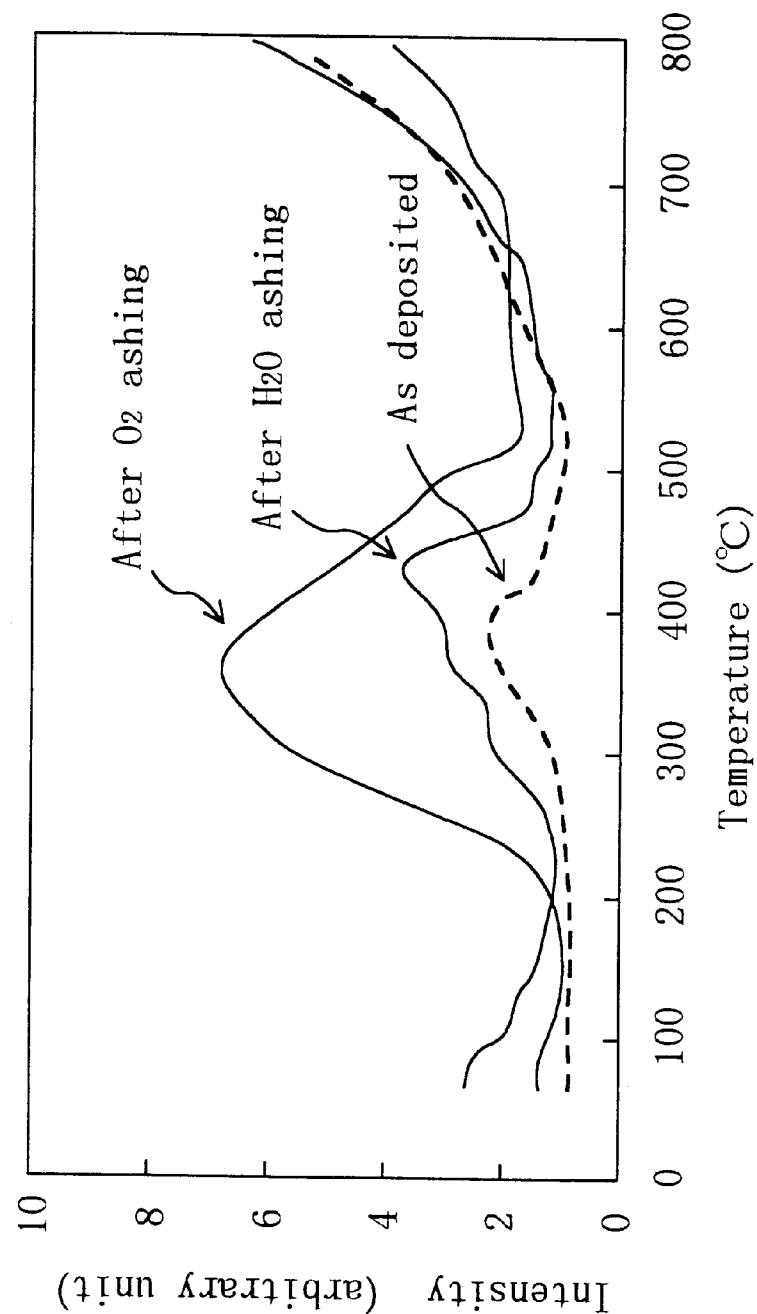
FIG. 6 is a graph illustrating the thermal desorption spectroscopy (TDS) spectra of an HSQ film subjected to $H_2O$ or $O_2$ plasma processing.

FIG. 6 illustrates the results obtained by analyzing the HSQ films, respectively subjected to the $H_2O$ plasma processing and the $O_2$ plasma processing, in accordance with a thermal desorption spectroscopy (TDS) in order to measure the contents of water in the films before and after ashing is performed. As shown in FIG. 6, the content of water in the HSQ film subjected to the $H_2O$ plasma processing is rather larger than that in the HSQ film that has not been subjected to the $H_2O$ plasma processing yet, but far smaller than that in the HSQ film subjected to the $O_2$ plasma processing.

As best as can be understood, the resist ashing using $H_2O$ plasma affects the HSQ film to a considerably smaller degree as compared with conventional ashing using $O_2$ plasma. The reason is believed to be as follows. In the conventional oxygen plasma processing, the Si—H bonds in the HSQ film are oxidized to decrease the number thereof and Si—OH bonds and H—OH bonds are produced to increase water in the film. In addition, as the oxidation advances, the film shrinks. In contrast, the active species contained in the $H_2O$ plasma, such as $H_2O$ in excited state, hydrogen (H) in atomic state and OH free radicals, do not react with the Si—H bonds in the HSQ film. In other words, since the $H_2O$ plasma is a reducing ambient containing hydrogen (H) in atomic state, the plasma hardly oxidizes the HSQ film and does not produce Si—OH bonds and H—OH bonds. Accordingly, the content of water in the HSQ film does not increase. Also, since the HSQ film is not oxidized, the film does not shrink either. Moreover, since the Si—OH bonds and H—OH bonds, usually causing remarkable polarization, are not produced, the relative dielectric constant of the film does not increase.

The present invention is not limited to a method for fabricating a semiconductor device including an HSQ film, but is broadly applicable to a method for fabricating a semiconductor device including an insulator film having Si—H bonds. For example, the present invention is applicable to a method for fabricating a semiconductor device including an insulator film made of an organic/inorganic mixed material having Si—H bonds and organic components such as methyl groups or a material producing Si—OH and H—OH bonds when oxidized, e.g., an organic material having Si—R bonds (where R is an alkyl group).

In accordance with conventional ashing using oxygen plasma, during the formation of a via hole by etching an insulator film, polymers are produced as a result of the reaction between an underlying interconnection layer made of aluminum or an aluminum alloy and a plasma gas used as an etching gas, and are left as residues on the sidewall of the via hole. These residues cannot be removed during the ashing process step using the oxygen plasma, but are usually cleaned and removed using an organic cleaner such as an organic solvent containing an amine group after the ashing is finished. However, when the residues are cleaned using an organic cleaner, part of the HSQ layer exposed on the sidewall of the via hole is unintentionally etched to form concave portions, thereby making it hard to form a plug thereon. In contrast, the method for ashing and removing a resist mask using $H_2O$ plasma according to the present invention can effectively remove these residues during the ashing. Thus, according to the present invention, the cleaning using an organic cleaner is not required after the ashing is finished. Accordingly, the exposed part of the HSQ layer is not etched and does not form concave portions. In addition, the present invention can advantageously simplify the process.

This problem of residues happens even when an insulator film having substantially no Si—H bonds is dry-etched. However, the resist ashing of the present invention using the $H_2O$ plasma can also solve the problem in such a situation. Clearly, the resist ashing of the present invention using the $H_2O$ plasma is broadly and effectively applicable to various types of methods for fabricating a semiconductor device requiring a process step of dry-etching an insulator film of every sort.

In this embodiment, the resist mask 7 is removed solely by performing the resist ashing process step using the $H_2O$ plasma (hereinafter, referred to as an "$H_2O$ plasma processing step"). Alternatively, the $H_2O$ plasma processing step and a resist ashing process step using $O_2$ plasma (hereinafter, referred to as an "$O_2$ plasma processing step") may be performed in combination. For example, after the resist mask 7 has been partially removed by performing the $H_2O$ plasma processing step, the remaining part of the resist mask 7 may be removed by performing the $O_2$ plasma processing step. Conversely, after the resist mask 7 has been selectively removed by performing the $O_2$ plasma processing step, the remaining part of the resist mask 7 may be removed by performing the $H_2O$ plasma processing step. Even if the $O_2$ plasma processing step is additionally performed in this manner, a time taken to perform resist ashing can also be shortened. Also, in such a case, since the $H_2O$ plasma is a reducing ambient including hydrogen (H) in atomic state, it is expected that the $H_2O$ plasma would reduce the surface of the HSQ layer oxidized during the $O_2$ plasma processing step performed first, thereby effectively decreasing the content of water in the HSQ layer. Thus, when resist ashing is performed as a combination of the $H_2O$ and $O_2$ plasma processing steps, the $H_2O$ plasma processing step is preferably performed last. In addition, it is preferable that the $O_2$ plasma processing is performed for no more than 20% of the total resist ashing time.

The gas used for producing the $H_2O$ plasma may be not only pure water vapor but also water vapor to which oxygen gas or nitrogen gas is added. In introducing oxygen gas into an apparatus as well as water vapor, if the amount of oxygen gas is relatively large, then the water in the HSQ layer possibly increases. Accordingly, the amount of oxygen gas (e.g., approximately 20%) is preferably smaller than the amount of water vapor (e.g., approximately 80%).

Also, instead of water vapor plasma, mixed gas plasma containing hydrogen gas and oxygen gas may also be used.

EMBODIMENT 2

The second embodiment of the present invention will be described with reference to FIGS. 7A through 7G.

Figure 7A:
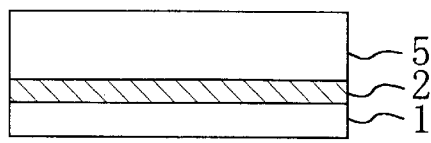
FIGS. 7A through 7G are cross-sectional views illustrating respective process steps for fabricating a semiconductor device according to a second embodiment of the present invention.

First, as shown in FIG. 7A, an insulator layer 2 (exemplary thickness: in the range from approximately 500 nm to 1000 nm) is formed on a semiconductor substrate 1. Then, an SOG layer 5 made of HSQ (hereinafter, simply referred to as an "HSQ layer") is applied thereon using a spin coater and the substrate is baked at approximately 400° C. for about 60 minutes within a nitrogen ambient. The insulator layer 2 is made of a material (e.g., silicon nitride) having a high etch selectivity with respect to the HSQ layer 5.

Figure 7E:
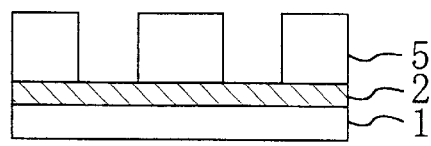
Figure 7B:
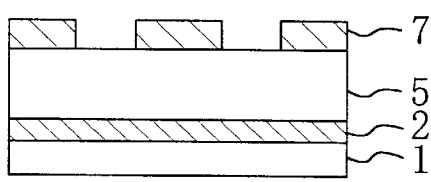

Subsequently, as shown in FIG. 7B, a resist mask 7 (exemplary thickness: in the range from approximately 0.8 $\mu$m to 1.3 $\mu$m) is formed over the HSQ layer 5. Thereafter, predetermined parts of the resist mask 7 are removed in accordance with a known photolithography technique, thereby forming openings in the resist mask 7. These opening define a pattern (shape and position) for interconnecting recesses to be formed during a subsequent process step. Then, as shown in FIG. 7C, parts of the HSQ layer 5 that are not covered with the resist mask 7 are removed by a dry etching technique to form grooveshaped recesses (interconnecting grooves) 12 in the HSQ layer 5. In this process step, the insulator layer 2 functions as an etching stopper for the HSQ layer 5. For example, the width of each groove 12 is in the range from approximately 0.2 $\mu$m to 0.6 $\mu$m, and the depth thereof is in the range from approximately 0.3 $\mu$m to 1.0 $\mu$m.

Figure 7F:
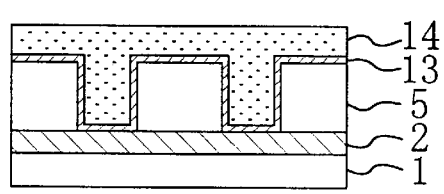
Figure 7C:
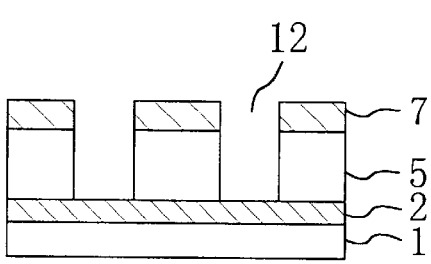
Figure 7G:
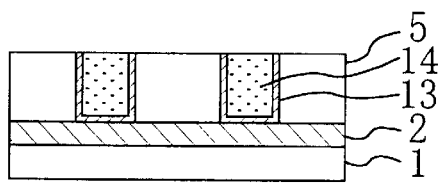
Figure 7D:
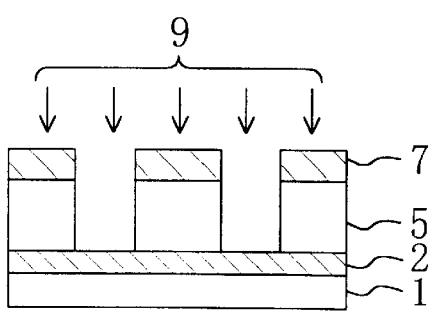

Next, plasma 9 is generated within an ambient containing hydrogen gas and oxygen gas inside an ashing apparatus, thereby ashing and removing the resist mask 7 as shown in FIG. 7D. The sidewall portions of the grooves 12 for buried interconnections, on which the HSQ layer 5 is exposed, and other portions of the HSQ layer 5, exposed after the resist mask 7 has been removed, are not affected by ashing and no degraded layers are formed (FIG. 7E). In this embodiment, the flow rate of the hydrogen gas is set in the range from approximately 500 sccm to 3000 sccm, and the flow rate of the oxygen gas is set in the range from approximately 100 sccm to 1500 sccm, for example.

Next, as shown in FIG. 7F, a barrier layer 13 made of titanium nitride, tantalum or the like is formed, and copper 14 is filled in thereon in accordance with an electroplating technique, for example. Then, unnecessary portions of the copper thin film 14 are removed by a chemical/mechanical polishing (CMP) technique to form buried interconnections as shown in FIG. 7G.

In this embodiment, a buried interconnection structure is formed. Alternatively, a so-called "dual damascene structure" in which a plug and an interconnection are buried simultaneously for electrically connecting upper- and lower-level interconnections to each other, may also be formed. Copper is used as a material for the interconnections. Alternatively, the interconnections may be made of aluminum, an aluminum alloy or the like.

In this embodiment, mixed gas plasma containing hydrogen gas and oxygen gas is used for resist ashing. Optionally, water vapor plasma may also be used and oxygen plasma processing step may be additionally performed as described in the first embodiment.

Figures 8, 9:
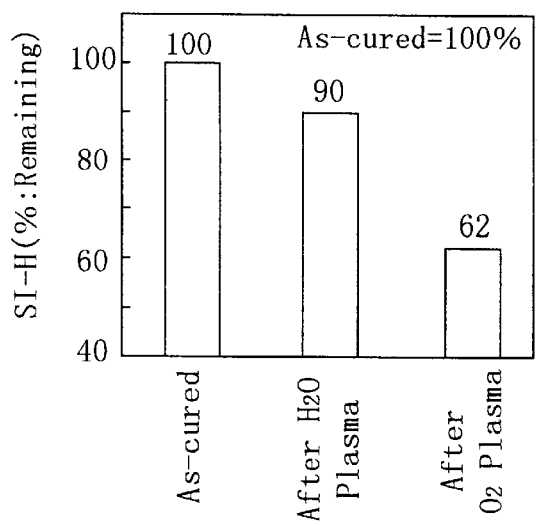
FIG. 8 details the experimental conditions of the $H_2O$ plasma process of the present invention and the conventional $O_2$ plasma process.
FIG. 9 illustrates the percentage of Si—H remaining in the HSQ film after the respective plasma treatments.
Figure 10:
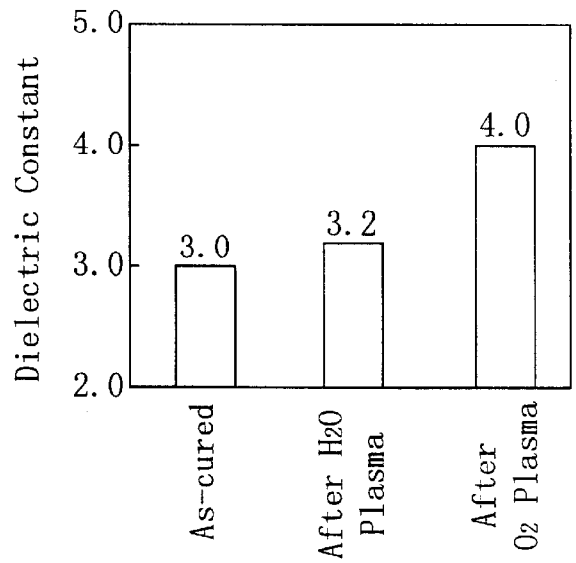
FIG. 10 illustrates the relative dielectric constants of the HSQ film before and after the respective plasma treatments.
Figure 11:
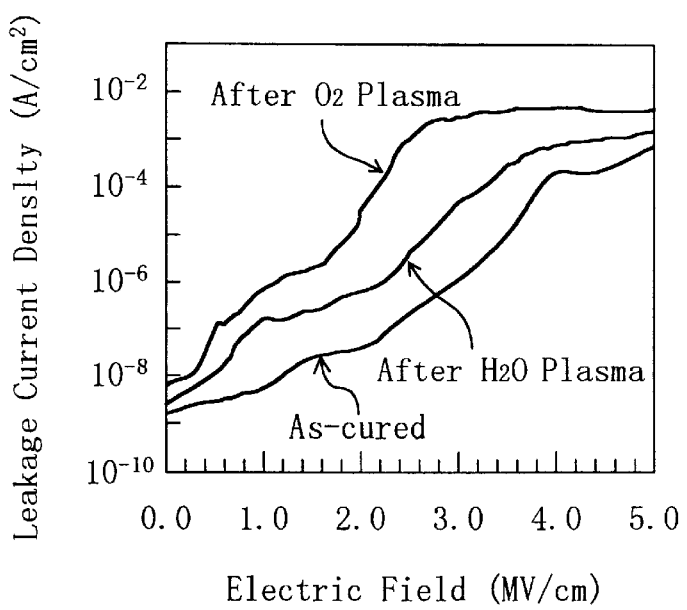
FIG. 11 illustrates the leakage current of the HSQ film before and after the respective plasma treatments.

FIGS. 8–13 illustrate experimental results of the method of the present invention in comparison with known techniques. More specifically, FIG. 8 details the experimental conditions of the $H_2O$ plasma process of the present invention and the conventional $O_2$ plasma process. FIG. 9 illustrates the percentage of Si—H remaining in the HSQ film after the respective plasma treatments. FIG. 10 illustrates the relative dielectric constants of the HSQ film before and after the respective plasma treatments. FIG. 11 illustrates the leakage current of the HSQ film before and after the respective plasma treatments. FIG. 12 is a chart summarizing the experimental results. Finally, FIG. 13 illustrates the variation of the dielectric constant throughout the resist removal process for the respective plasma treatments. It is noted that the HSQ film is subjected to a chemical removal process and then an annealing process. As shown in FIG. 13, the dielectric constant of the HSQ film increases in accordance with the $H_2O$ plasma process of the present invention. However, the increase in dielectric constant during the $H_2O$ process is less abrupt as compared to the conventional $O_2$ process.

In the foregoing embodiments, the resist mask is ashed by directly exposing the resist mask to plasma. Alternatively, a substrate may be disposed at a position distant from plasma and active species contained in plasma, such as $H_2O$ in excited state, H in atomic state and/or OH free radicals, may be transported to the surface of the substrate. Also, so long as the resist mask can be ashed by using plasma containing any other reducing gas than the exemplified ones, it is also possible to prevent an insulator film having Si—H bonds from being degraded.

In the above-described embodiments of the present invention, an insulator film having Si—H bonds is supposed to be formed on a silicon substrate. However, the present invention is not limited to such embodiments. Alternatively, the present invention is effectively applicable to a method for fabricating a semiconductor device including a process step of forming an insulator film having Si—H bonds on an insulating substrate. Such semiconductor devices include a liquid crystal display device in which a large number of thin film transistors are formed on a glass substrate, for example.

According to the present invention, a resist mask is ashed and removed by using plasma produced from a gas containing water vapor or hydrogen. Thus, even if an insulator film having Si—H bonds is exposed, it is possible to prevent the Si—H bonds from being oxidized because of ashing. As a result, it is possible to prevent a degraded layer containing a lot of water from being formed on the exposed surface of the insulator film. Accordingly, interconnections formed on the insulator film during a subsequent process step are not deteriorated. Consequently, a highly reliable semiconductor device can be provided. In particular, if an insulator film such as a hydrogen silsesquioxane (HSQ) layer is used as an interlevel dielectric film, a semiconductor device with reduced wiring capacitance can be fabricated at a high production yield. This is because the relative dielectric constant of the HSQ layer is lower than that of any other CVD oxide film.

During the removal of a resist mask, if an oxygen plasma processing step for ashing the resist mask by using plasma produced from oxygen gas is additionally performed, the time taken to remove the resist mask can be shortened. This is because a rate at which a resist mask is ashed by oxygen plasma is higher than a rate at which the resist mask is ashed by plasma produced from a gas containing water vapor or hydrogen.

If the process step of ashing a resist mask by using plasma produced from a gas containing water vapor or hydrogen is performed posterior to the oxygen plasma processing step, then a degraded layer, formed during the ashing using the oxygen plasma, can be restored into its original state before the degradation.

Although the methods of the present invention have been described in conjunction with an exemplary embodiment, it is appreciated that the invention may be implemented in a variety of other ways. Consequently, it is to be understood that the particular embodiments shown and described by way of illustration are in no way intended to be considered limiting. Reference to the details of these embodiments is not intended to limit the scope of the claims.

What is claimed is:

1. A method for fabricating a semiconductor device, comprising the steps of:
   a) forming an insulator film having Si—H bonds;
   b) forming a resist mask over a selected region of the insulator film;
   c) etching a part of the insulator film that is not covered with the resist mask, thereby forming a recess in the insulator film; and
   d) removing the resist mask,
   wherein the step d) includes the step of e) ashing the resist mask by using plasma produced from a gas comprising water vapor as a main component, and said plasma utilized for ashing the resist mask is produced from a gas which does not contain $CF_4$.

2. The method of claim 1, wherein the insulator film includes a hydrogen silsesquioxane layer.

3. The method of claim 1, wherein the step d) further includes the step of f) ashing the resist mask by using plasma produced from oxygen gas, and the step f) is performed prior to the step e).

4. The method of one of claims 1 to 3, wherein in the step c), the insulator film is etched until the recess constitutes a via hole reaching an interconnection located under the insulator film.

5. The method of claim 4, further comprising the step of g) filling in the recess of the insulator film with a conductive material to make electrical contact between the conductive material and the interconnection.

6. The method of claim 1, further comprising the step of chemical removal of residues in the recess of the insulator film using an organic solvent after the step (e).

7. The method of claim 6, further comprising the step of annealing the insulator film after the step of chemical removal.

* * * * *